(12) United States Patent
Carlson

(10) Patent No.: US 10,249,161 B2
(45) Date of Patent: Apr. 2, 2019

(54) MAGNETIC FIELD SENSOR

(71) Applicant: Julian Carlson, Surrey (CA)

(72) Inventor: Julian Carlson, Surrey (CA)

(73) Assignee: 1010210 B.C. Ltd., Surrey (CA)

( * ) Notice: Subject to any disclaimer, the term of this patent is extended or adjusted under 35 U.S.C. 154(b) by 83 days.

(21) Appl. No.: 14/341,710

(22) Filed: Jul. 25, 2014

(65) Prior Publication Data

US 2016/0027272 A1    Jan. 28, 2016

(51) Int. Cl.
| | |
|---|---|
| *G01R 33/02* | (2006.01) |
| *G08B 13/24* | (2006.01) |
| *G01R 33/00* | (2006.01) |
| *G08B 5/36* | (2006.01) |
| *G01V 3/08* | (2006.01) |
| *G08B 3/10* | (2006.01) |
| *G08B 6/00* | (2006.01) |

(52) U.S. Cl.
CPC ..... *G08B 13/2491* (2013.01); *G01R 33/0023* (2013.01); *G01R 33/02* (2013.01); *G01V 3/081* (2013.01); *G08B 3/10* (2013.01); *G08B 5/36* (2013.01); *G08B 6/00* (2013.01); *G08B 13/24* (2013.01)

(58) Field of Classification Search
CPC ........ G08B 13/06; G08B 13/08; G08B 13/24; G08B 13/2408; G08B 13/249; G08B 13/02; G08B 13/2491; G08B 13/149; G08B 25/0008; G08B 29/046; G08B 29/185; G01R 33/02; G01R 33/0023
USPC ...... 324/252, 207.11, 207.2, 207.21, 207.26; 340/501, 511, 541, 545.1, 542, 547, 551, 340/567, 686.1, 686, 545.3, 686.6
See application file for complete search history.

(56) References Cited

U.S. PATENT DOCUMENTS

| | | | | |
|---|---|---|---|---|
| 3,986,183 | A | * 10/1976 | Fujiwara | ............. G08B 13/08 200/61.19 |
| 4,296,410 | A | 10/1981 | Higgs et al. | |
| 4,954,812 | A | 9/1990 | Lebron | |
| 5,434,500 | A | 7/1995 | Hauck et al. | |
| 6,400,267 | B1 * | 6/2002 | Gordon-Levitt | ... G05B 19/0423 335/205 |
| 7,221,230 | B2 | 5/2007 | Partridge | |
| 2001/0030605 | A1 * | 10/2001 | Novotny | ............. G08B 13/08 340/545.1 |

(Continued)

FOREIGN PATENT DOCUMENTS

CN          201780643 U      3/2011

OTHER PUBLICATIONS

WIPO, International Searching Authority, Written Opinion of the International Searching Authority dated Nov. 5, 2015 in International Patent Application No. PCT/CA2015/505711, 7 pages.

(Continued)

*Primary Examiner* — Jeff Natalini
*Assistant Examiner* — Steven Yeninas
(74) *Attorney, Agent, or Firm* — Cameron IP

(57) ABSTRACT

A magnetic field sensor comprises a power source, an indicator and a microprocessor. The power source supplies current to the indicator. The indicator turns on when a magnetic field is sensed and the indicator turns off when a magnetic field is not sensed. The microprocessor renders the indicator inoperable a predetermined period of time after the magnetic field sensor is powered up.

10 Claims, 19 Drawing Sheets

(56) References Cited

U.S. PATENT DOCUMENTS

| | | | |
|---|---|---|---|
| 2005/0024207 A1* | 2/2005 | Schebel | G08B 13/08 |
| | | | 340/545.2 |
| 2005/0179545 A1 | 8/2005 | Bergman et al. | |
| 2008/0290864 A1 | 11/2008 | Latraverse | |
| 2010/0102907 A1 | 4/2010 | Schebel et al. | |
| 2013/0057404 A1* | 3/2013 | Thibault | G08B 29/22 |
| | | | 340/545.1 |
| 2013/0057405 A1* | 3/2013 | Seelman | G08B 29/185 |
| | | | 340/545.2 |
| 2013/0257611 A1* | 10/2013 | Lamb | G08B 25/008 |
| | | | 340/501 |
| 2014/0340222 A1* | 11/2014 | Thornton | G08B 7/062 |
| | | | 340/539.17 |
| 2015/0199888 A1* | 7/2015 | Shapira | G08B 13/08 |
| | | | 340/547 |

OTHER PUBLICATIONS

WIPO, International Searching Authority, International Search Report dated Nov. 5, 2015 in International Patent Application No. PCT/CA2015/505711, 5 pages.

Vision Security: "Installation & Operation Manual ZD 2012", published Feb. 10, 2011.

Machine translation of Chinese Patent No. 201780643 to CHEN, obtained from the Canadian Intellectual Property Office in its capacity as an international search authority.

\* cited by examiner

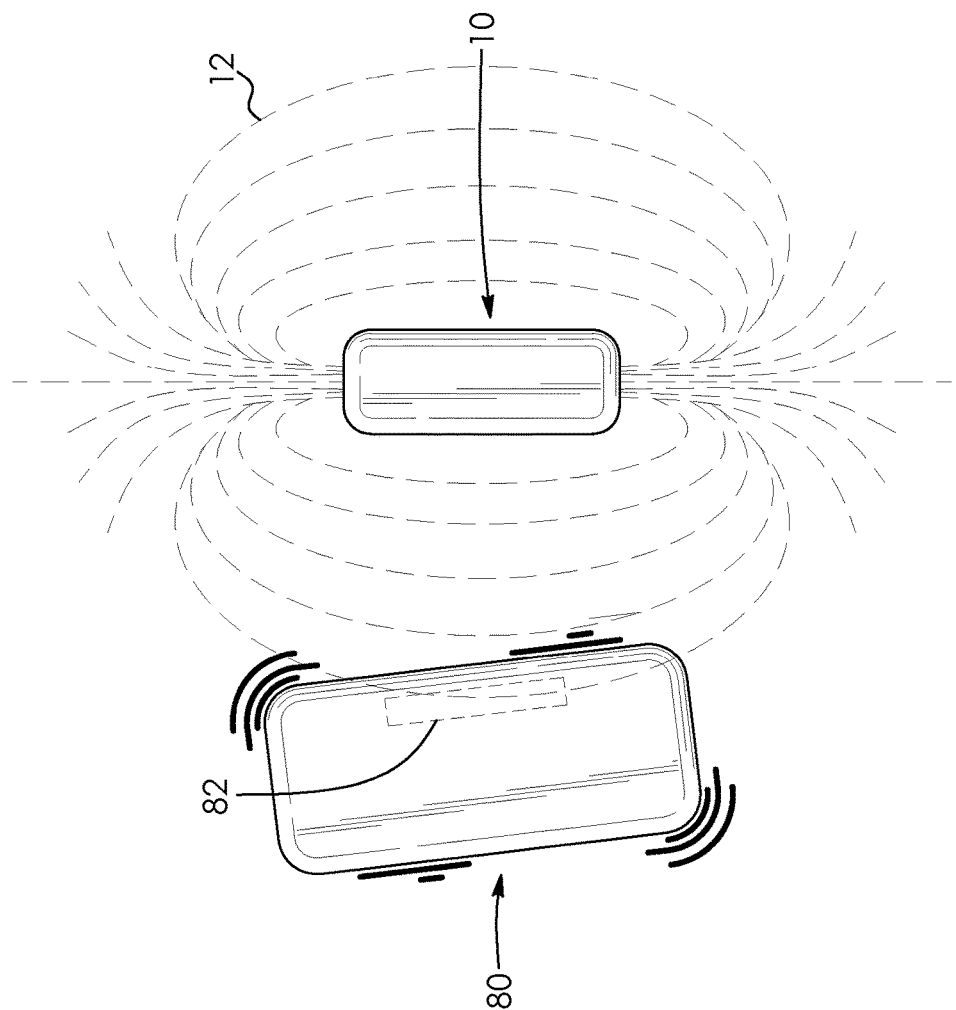

MAGNETIC FIELD SENSOR

BACKGROUND OF THE INVENTION

Field of the Invention

The present invention relates to a magnetic field sensor and, in particular, to a magnetic field sensor provided with an indicator which indicates the presence or absence of a magnetic field.

Description of the Related Art

It is known to provide a magnetic field sensor with a light-emitting diode indicator. U.S. Pat. No. 4,296,410, which issued on Oct. 20, 1981 to Higgs et al., discloses an integrated circuit including a Hall element and a threshold detector. The threshold detector is encased in a plastic housing with the plane of the Hall element parallel with a face of the housing to provide a two-state Hall element proximity sensor. A light-emitting diode is mounted in the housing and is connected to the output of the detector. This provides visual indication of the state of the sensor. A kit includes the sensor and a compatible magnet which may be used as a proximity sensor in a security alarm system.

SUMMARY OF THE INVENTION

There is provided a magnetic field sensor comprising a power source, an indicator and a microprocessor. The indicator may be an auditory indicator, a vibratory indicator or a visual indicator. The power source supplies current to the indicator. The indicator turns on when a magnetic field is sensed and the indicator turns off when a magnetic field is not sensed. The microprocessor renders the indicator inoperable a predetermined period of time after the magnetic field sensor is powered up.

In one example, the indicator may be a light-emitting diode. The power source may be a coin cell battery. The magnetic field sensor may include a supercapacitor. The magnetic field sensor may also include a tamper switch. The magnetic field sensor may further include a radio and an antenna.

The improved magnetic field sensor disclosed herein may be used together with a magnet as a proximity sensor, for example, as a door sensor or window sensor in a security alarm system.

BRIEF DESCRIPTIONS OF DRAWINGS

The invention will be more readily understood from the following description of the embodiments thereof given, by way of example only, with reference to the accompanying drawings, in which:

FIG. 19 is a perspective view of yet another improved magnetic sensor.

DESCRIPTIONS OF THE PREFERRED EMBODIMENTS

Figure 1:
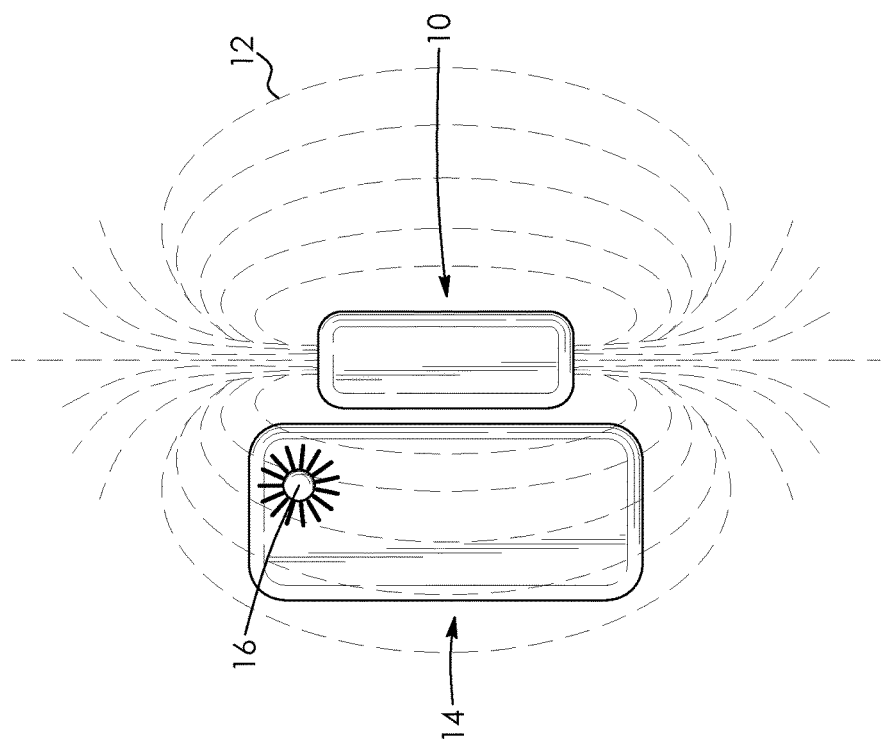
FIG. 1 is a perspective view of a magnet and an improved magnetic field sensor.
Figure 2:
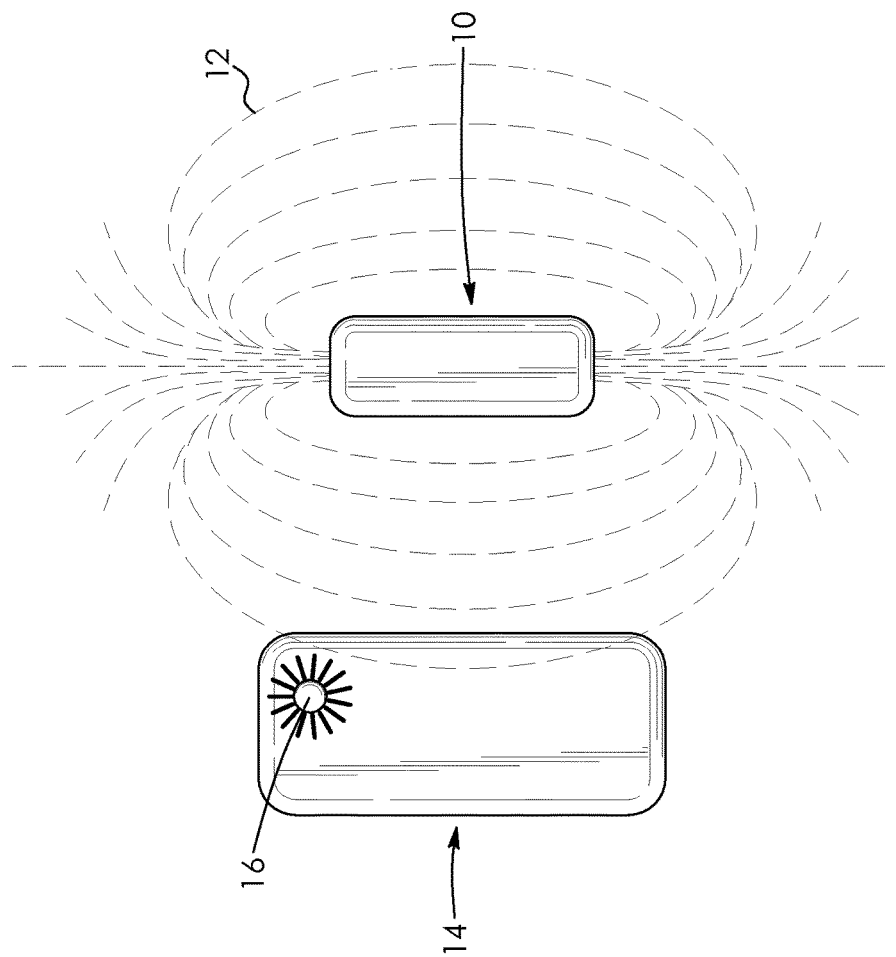
FIG. 2 is another perspective view of the magnet and the magnetic field sensor of FIG. 1.
Figure 3:
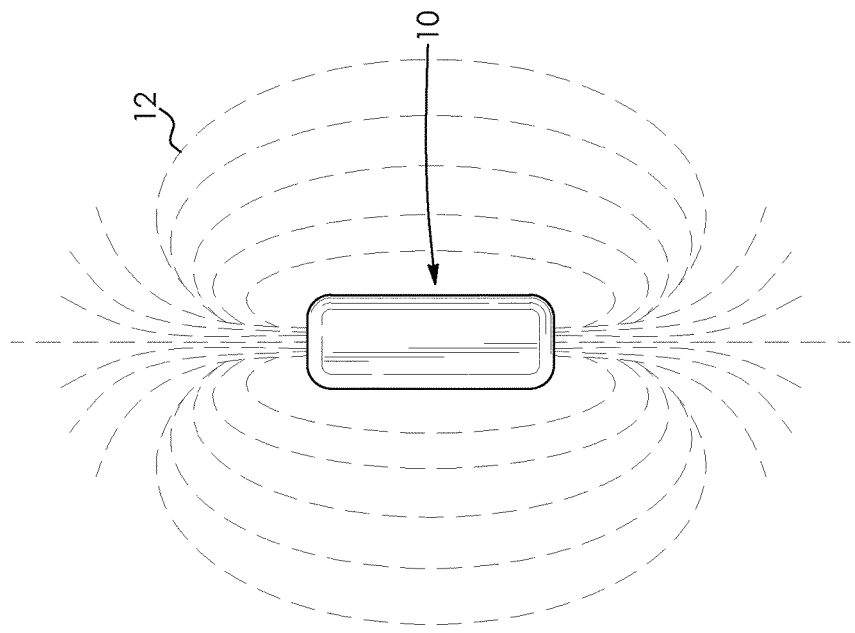
FIG. 3 is another perspective view of the magnet and the magnetic field sensor of FIG. 1.
Figure 3:
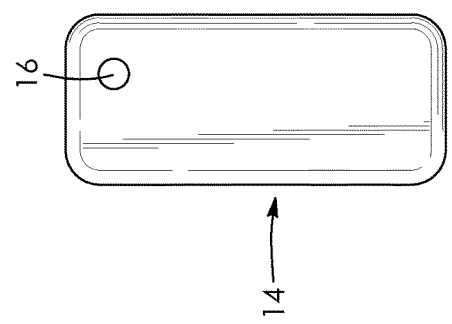

Referring to the drawings and first to FIGS. 1 to 3, a magnet 10 is shown. The magnet 10 generates a magnetic field 12 which is sensed by a magnetic field sensor 14. The magnetic field sensor 14 includes an indicator which, in this example, is a visual indicator in the form of an indicator light 16 that turns on when the magnetic field sensor 14 is within the magnetic field 12 as shown in FIGS. 1 and 2. The indicator light 16 turns off when the magnetic field sensor 14 is outside the magnetic field 12 as shown in FIG. 3. The indicator light 16 may accordingly provide a visual indication as to the presence or absence of a magnetic field.

Figure 4:
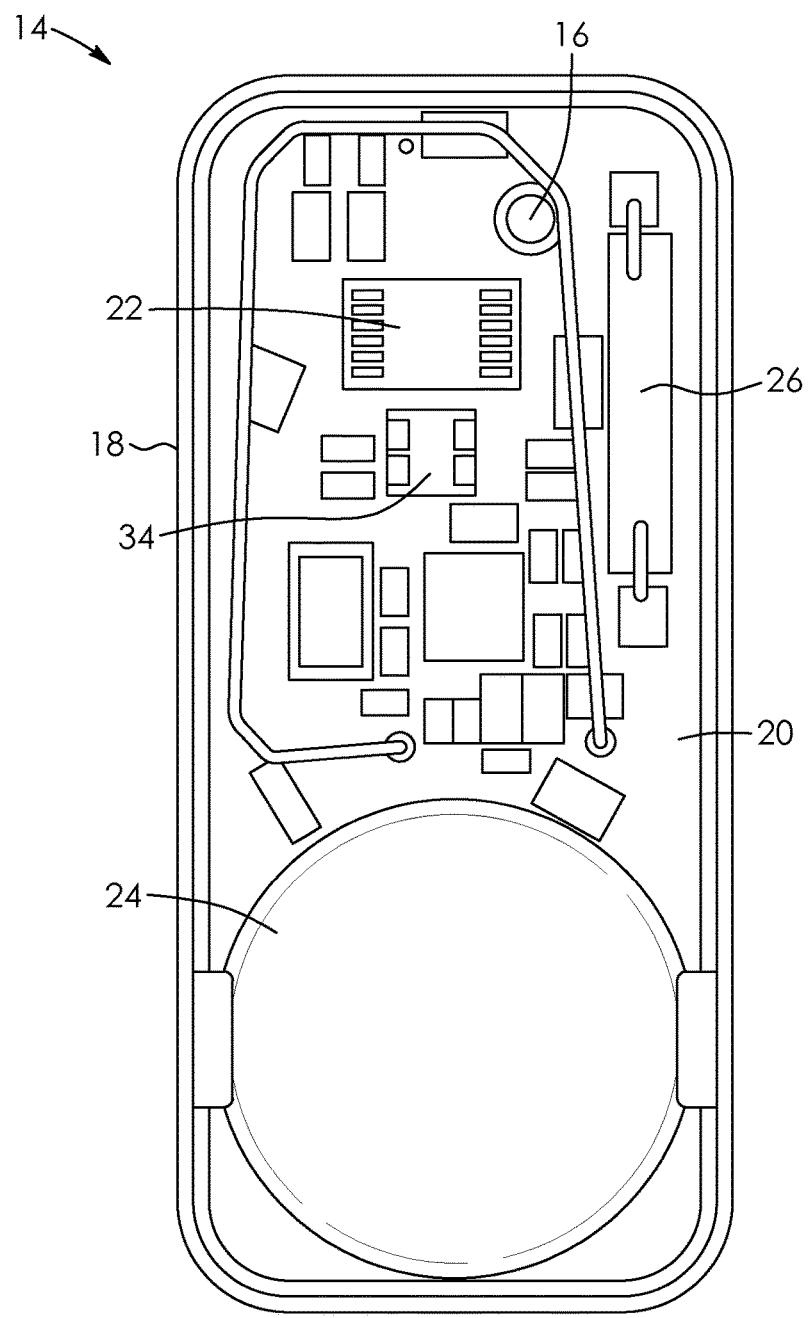
FIG. 4 is a cross-sectional view of the magnetic field sensor of FIG. 1.

The magnetic field sensor 14 is shown in greater detail in FIG. 4 and, in this example, is a substantially rectangular parallelepiped with rounded corners but may be other shapes. The magnetic field sensor 14 includes a housing 18 and a circuit board 20 disposed within the housing. The indicator light 16 is mounted on the circuit board 20 together with a microprocessor 22, a power source in the form of a coin cell battery 24 although any AC or DC power source may be used, and a device which senses a magnetic field in the form of a reed switch 26. In this example, the indicator light 16 is a light-emitting diode package and includes a blue light-emitting diode, a green light-emitting diode, and a red light-emitting diode. The reed switch 26 is actuated by a magnetic field and sends an electrical signal to the microprocessor 22 to turn on the indicator light 16. In the absence of a magnetic field, no electrical signal is sent to the microprocessor 22 and the indicator light 16 is turned off. The sensitivity of the reed switch 26 can be adjusted to adjust the sensitivity of the magnetic field sensor 14. This may be used to set a maximum or minimum distance at which the magnetic field sensor 14 is able to sense a magnet. In other examples, any device which senses magnetic fields such as a magnetoresistive sensor or magnasphere may be used in place of the reed switch.

Figure 5:
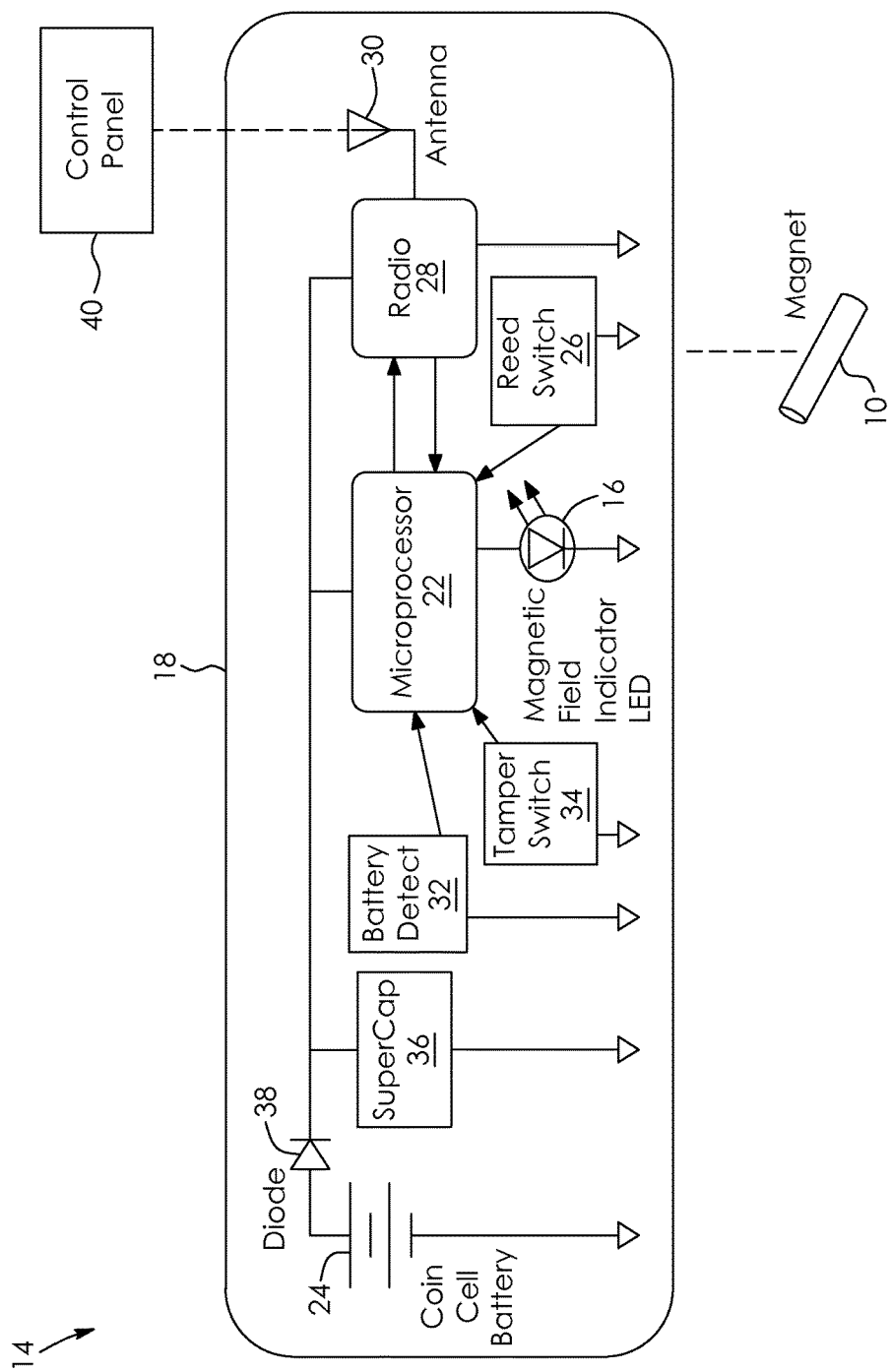
FIG. 5 is a schematic diagram of the magnetic field sensor of FIG. 1.

Referring now to FIG. 5, in this example, the magnetic field sensor 14 includes a radio 28 and an antenna 30 which allow the magnetic field sensor 14 to transmit and receive radio signals. The antenna 30 may communicate with a control panel 40 as part of a security alarm system. There is also a battery detection circuit 32, a tamper switch 34, and a supercapacitor 36. The battery detection circuit 32 and tamper switch 34 are both conventional and in communication with the microprocessor 22. The supercapacitor 36 may be used to assist the coin cell battery 24 as the power source. Without the supercapacitor 36 the coin cell battery 24 may not be able to provide the surge current required when the radio 28 and the antenna 30 transmit and receive radio signals. This is due to the internal resistance of the coin cell battery. A coin cell battery generally cannot be used in applications requiring current in excess of about 20 to 30 milliamperes. The internal resistance of the coin cell battery causes a voltage drop when larger currents are required. This may cause the terminal voltage to drop below a minimum acceptable level of, for example, 2.2 volts.

The supercapacitor 36 has a low profile which, in combination with use of the coin cell battery 24, allows the magnetic field sensor 14 to be relatively small. The supercapacitor 36 allows for high short term current draws while still providing a terminal voltage of, for example, 3.0 volts. Without the supercapacitor 36 a larger battery may have to be used as a power source. The supercapacitor 36 may have a sufficient residual charge to prevent the microprocessor 22 from properly detecting the removal of the coin cell battery 24 during battery replacement. However, the battery detection circuit 32 allows the microprocessor 22 to shut down properly when the coin cell battery 24 is removed. There is also a diode 38 connected in series between the coin cell battery 24 and the supercapacitor 36 to ensure that the coin cell battery 24 is not reverse charged if the supercapacitor 36 has a higher voltage. The tamper switch 34 may be internal or external of the housing 18 and detects when a lid of the housing 18 is removed. The tamper switch sends a signal to the microprocessor 22 which restarts an algorithm related to the sensing of a magnetic field when the tamper switch 34 detects that the lid of the housing is removed.

Referring now to FIGS. 6 to 15, the magnet 10 and magnetic field sensor 14 are shown in use as a proximity sensor in the form of a window sensor of a security alarm system. It will however be understood by a person skilled in the art that the magnet 10 and magnetic field sensor 14 may also be used as a door sensor or in any other proximity sensor application. The magnet 10 and magnetic field sensor 14 are each mounted on a window 50 with the magnetic field sensor 14 generally being mounted first, although this is not strictly required. The magnet 10 is mounted on a stile 52 of the window 50 while the magnetic field sensor 14 is mounted on a side jamb 54 of the window near a sill 56 thereof. The window 50 is fully closed in FIGS. 6 to 8 with a bottom rail 58 of the window abutting the sill 56 thereof.

Figure 6:
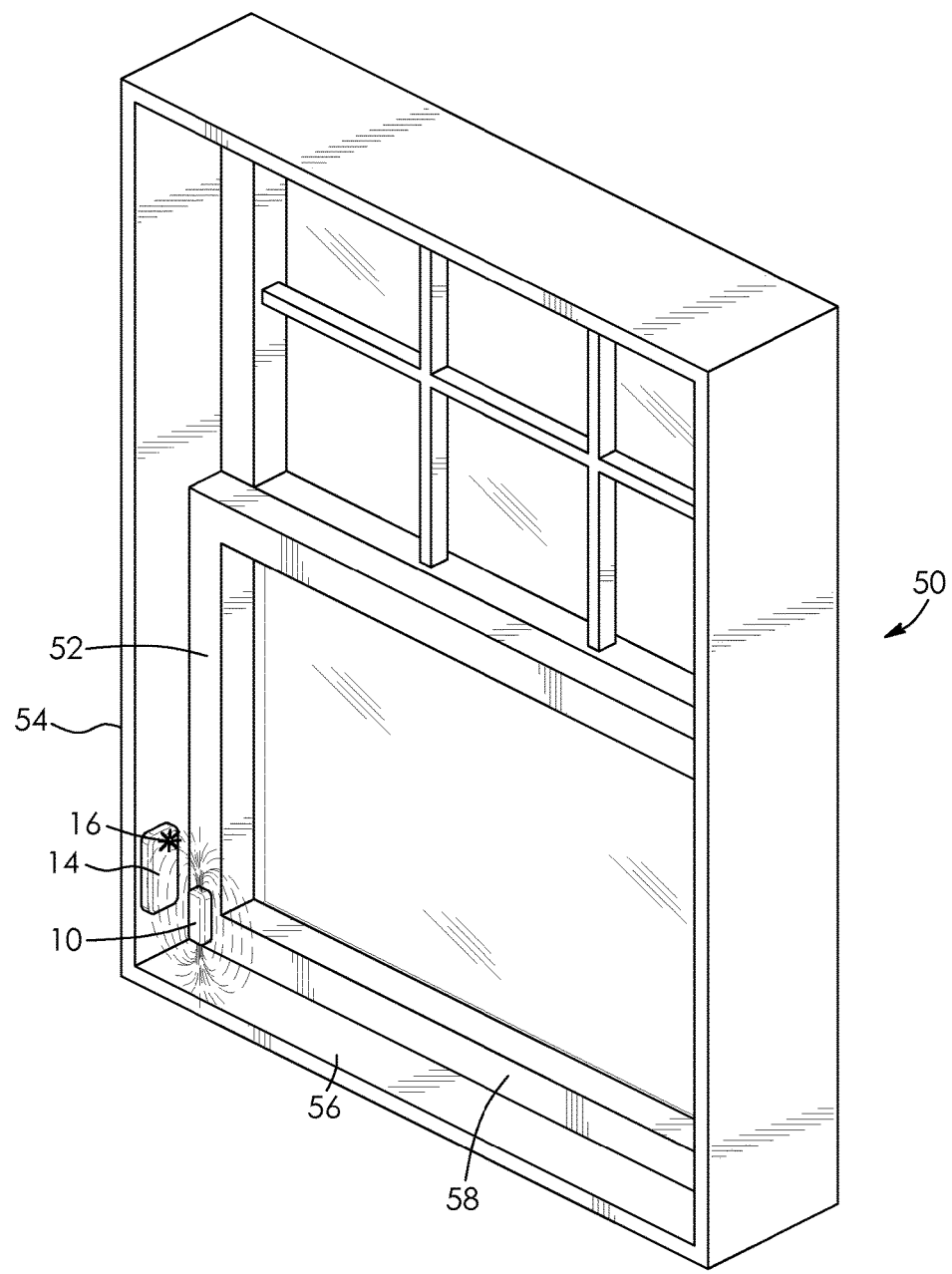
FIG. 6 is a perspective view showing the magnet and the magnetic field sensor of FIG. 1 being used as a window sensor in a security alarm system with the window closed.
Figure 7:
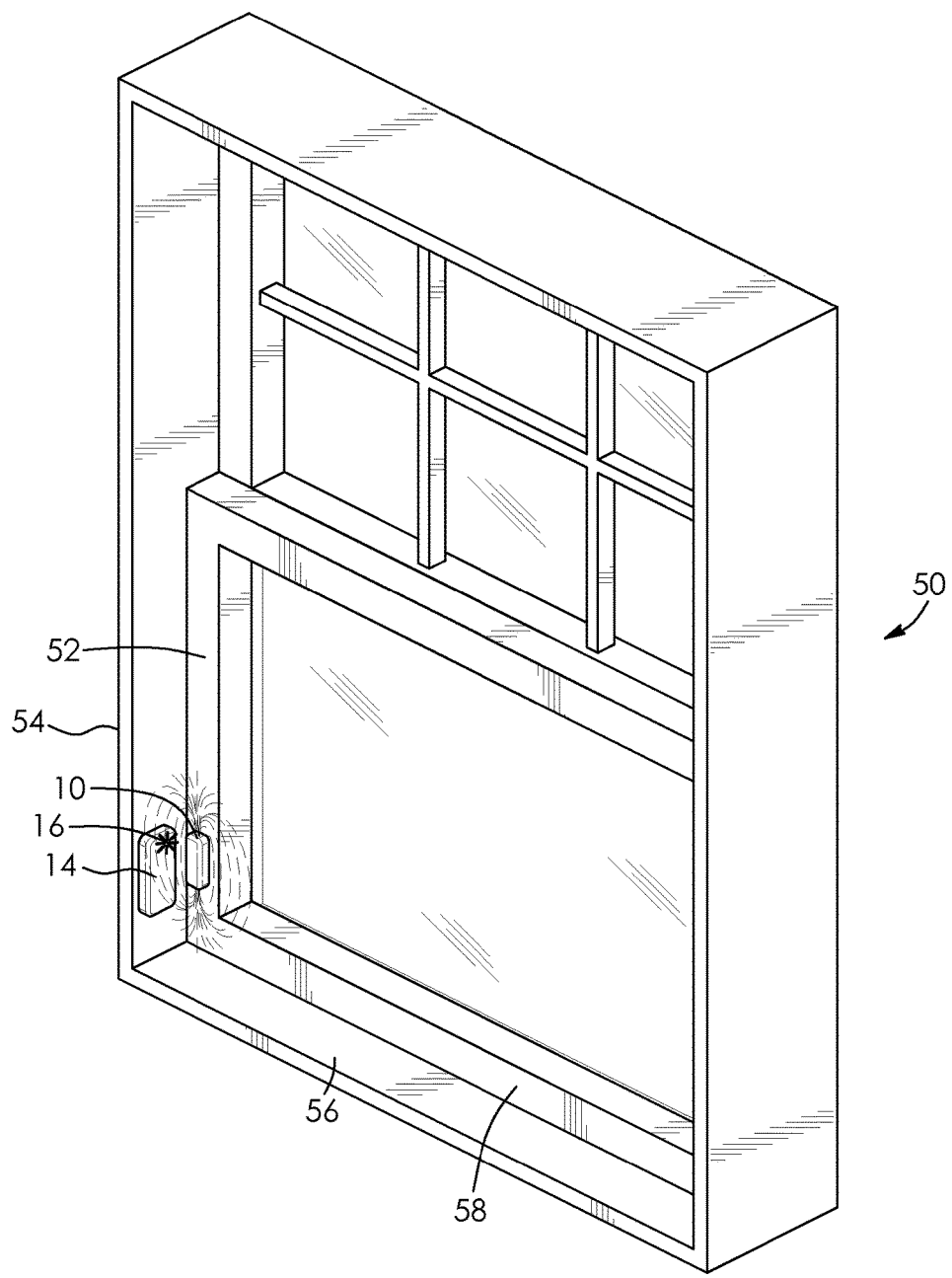
FIG. 7 is another perspective view showing the magnet and the magnetic field sensor of FIG. 1 being used as a window sensor in a security alarm system with the window closed.
Figure 8:
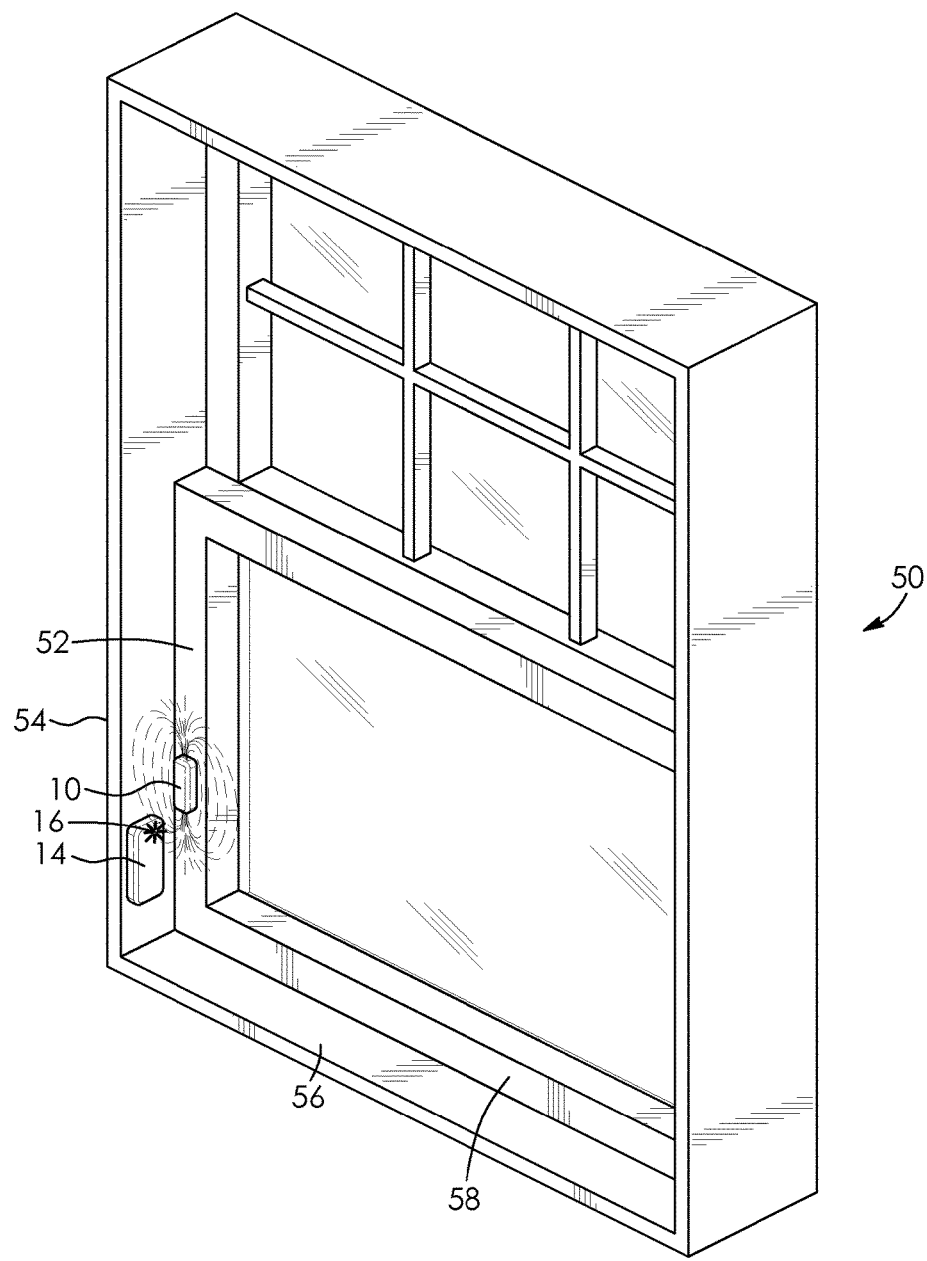
FIG. 8 is another perspective view showing the magnet and the magnetic field sensor of FIG. 1 being used as a window sensor in a security alarm system with the window closed.

When the window 50 is fully closed, the magnetic field sensor 14 is able to sense a magnetic field generated by the magnet 10 when the magnet is mounted along the stile 52 as indicated by the indicator light 16 which is turned on in FIGS. 6 to 8. The indicator light 16 of the magnetic field sensor 14 is turned on when the magnet 10 is mounted on the stile 52 at a first position adjacent to the bottom rail 58 of the window 50 as shown in FIG. 6, at a second position away from the bottom rail 58 of the window 50 as shown in FIG. 7, and at a third position further away from the bottom rail 58 of the window 50 as shown in FIG. 8. This provides a visible confirmation to an installer that, when the magnetic field sensor 14 is mounted on the side jamb 54 of the window 50 near the sill 56 thereof, the magnet 10 may be mounted anywhere on the stile 52 between the first position and the third position for the magnetic field sensor to still be able to sense a magnetic field generated by the magnet. An alarm will accordingly not be triggered when the window 50 is fully closed and the magnet 10 and magnetic field sensor 14 are positioned relative to one another as shown in FIGS. 6 to 8.

Figure 9:
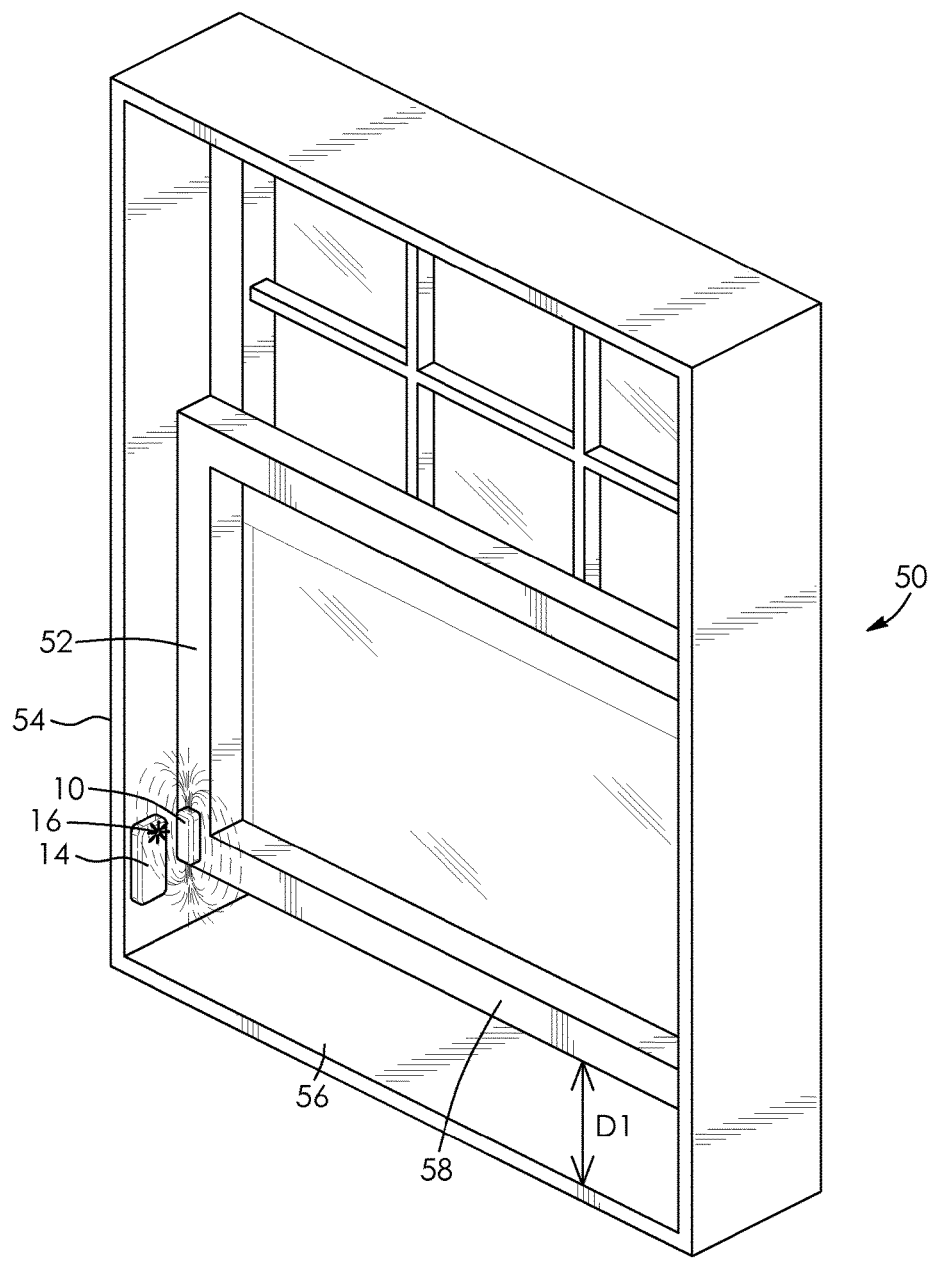
FIG. 9 is a perspective view showing the magnet and the magnetic field sensor of FIG. 1 being used as a window sensor in a security alarm system with the window opened a distance D1.
Figure 10:
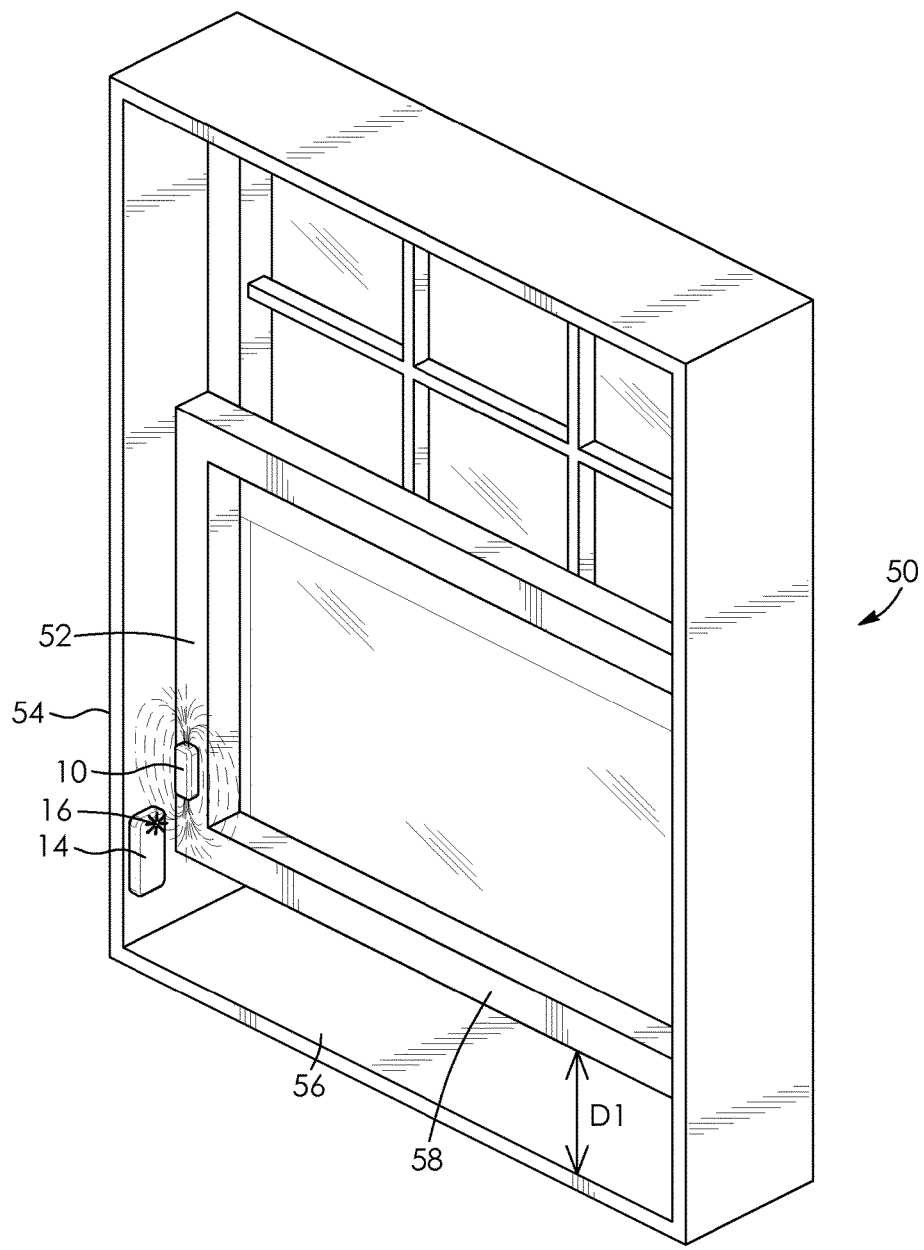
FIG. 10 is another perspective view showing the magnet and the magnetic field sensor of FIG. 1 being used as a window sensor in a security alarm system with the window opened a distance D1.
Figure 11:
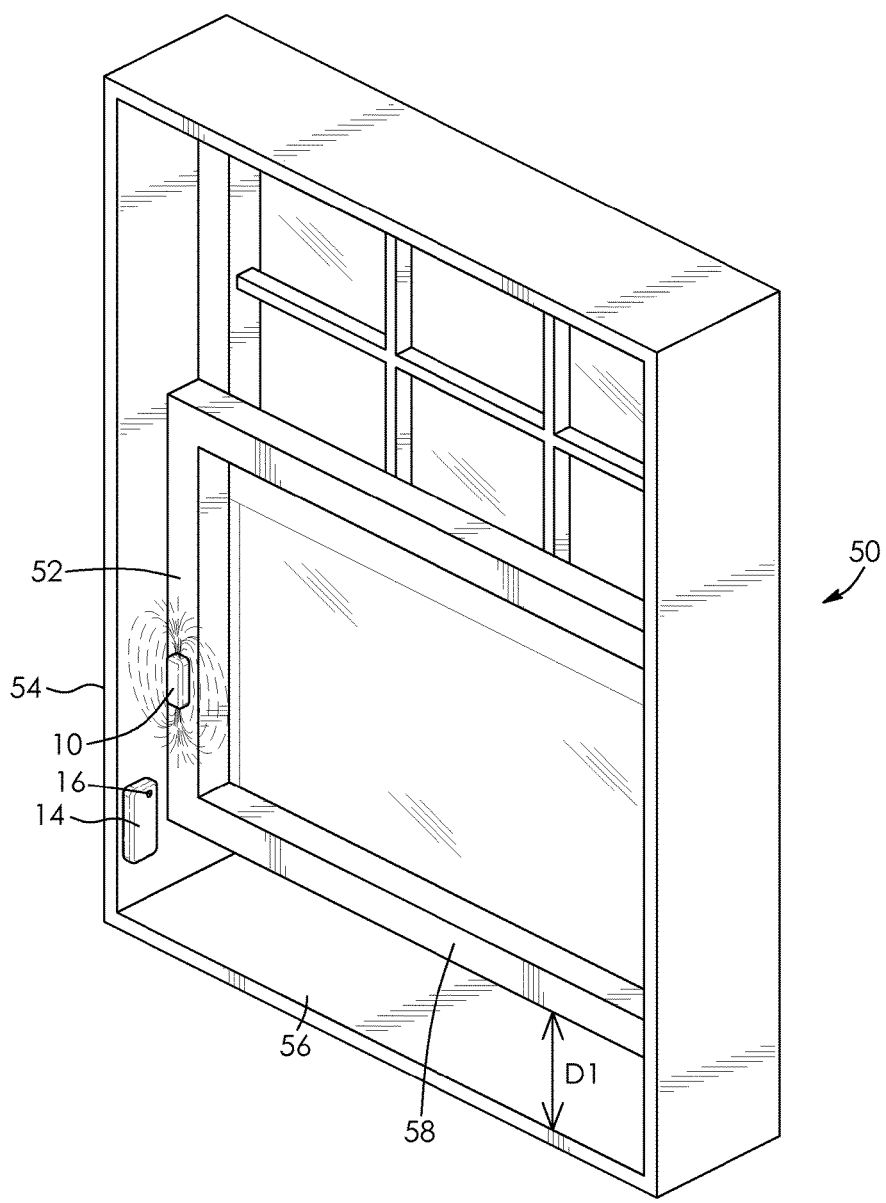
FIG. 11 is another perspective view showing the magnet and the magnetic field sensor of FIG. 1 being used as a window sensor in a security alarm system with the window opened a distance D1.

However, it may be desirable for an alarm to not be triggered when the window 50 is not fully closed. This would allow the window 50 to be partially opened for ventilation but not enough to allow an intruder to enter through the window. For example, as shown in FIGS. 9 to 11, it may be desired to allow the window 50 to be opened a distance of D1 without triggering an alarm. FIG. 9 shows that the magnetic field sensor 14 is able to sense the magnetic field generated by the magnet 10, as visually indicated by the indicator light 16 which is turned on, when the magnet 10 is mounted on the stile 52 adjacent to the bottom rail 58. FIG. 10 shows that the magnetic field sensor 14 is also able to sense the magnetic field generated by the magnet 10, as visually indicated by the indicator light 16 which is turned on, when the magnet 10 is mounted on the stile 52 away from the bottom rail 58. FIG. 11 shows that the magnetic field sensor 14 is unable to sense the magnetic field generated by the magnet 10, as visually indicated by the indicator light 16 which is turned off, when the magnet 10 is mounted on the stile 52 further away from the bottom rail 58. The indicator light 16 accordingly provides a visual indication to an installer as to where on the stile 52 the magnet 10 may be mounted to allow the window 50 to be opened a distance of D1 without triggering an alarm.

Figure 12:
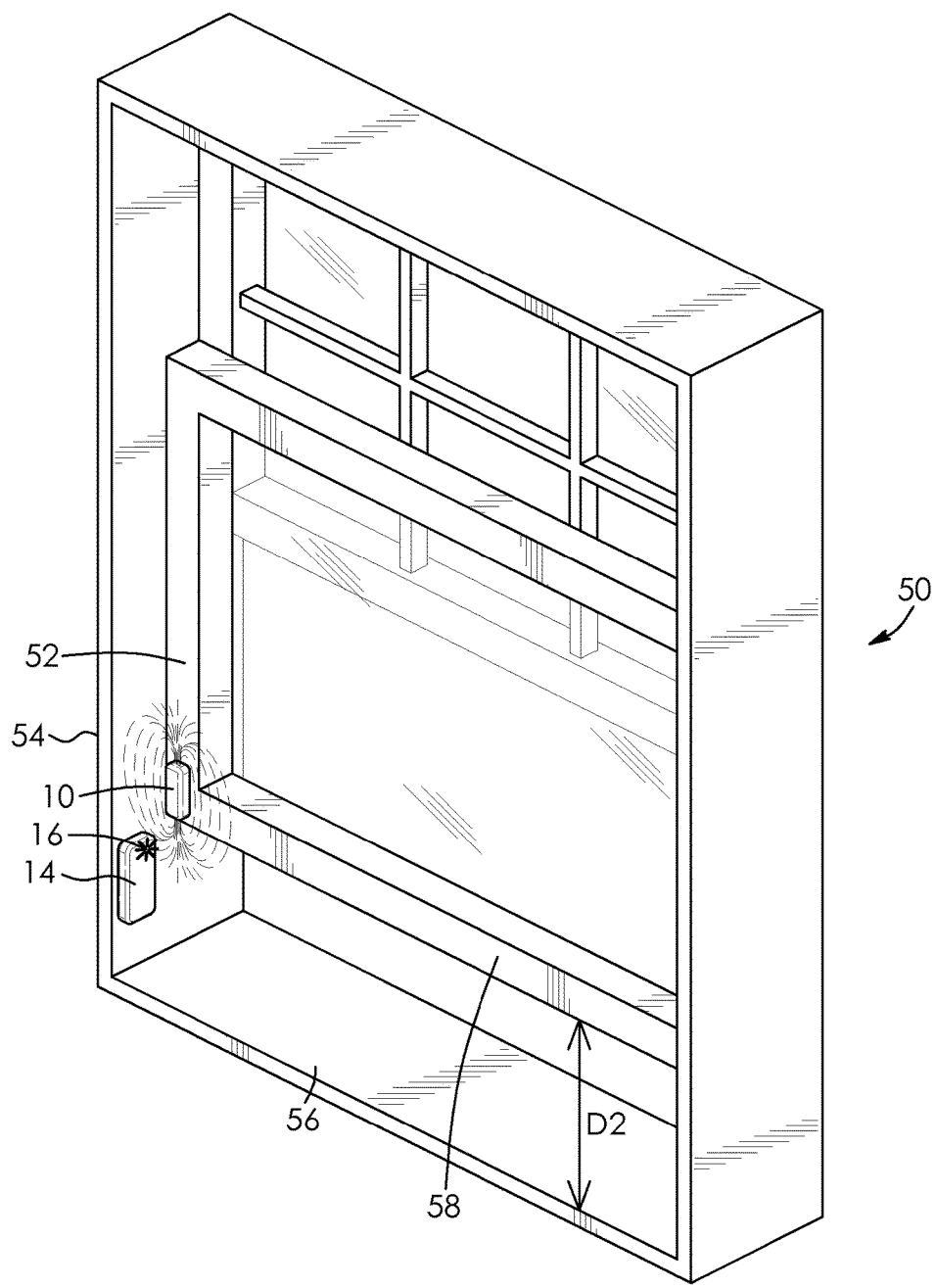
FIG. 12 is a perspective view showing the magnet and the magnetic field sensor of FIG. 1 being used as a window sensor in a security alarm system with the window opened a distance D2.
Figure 13:
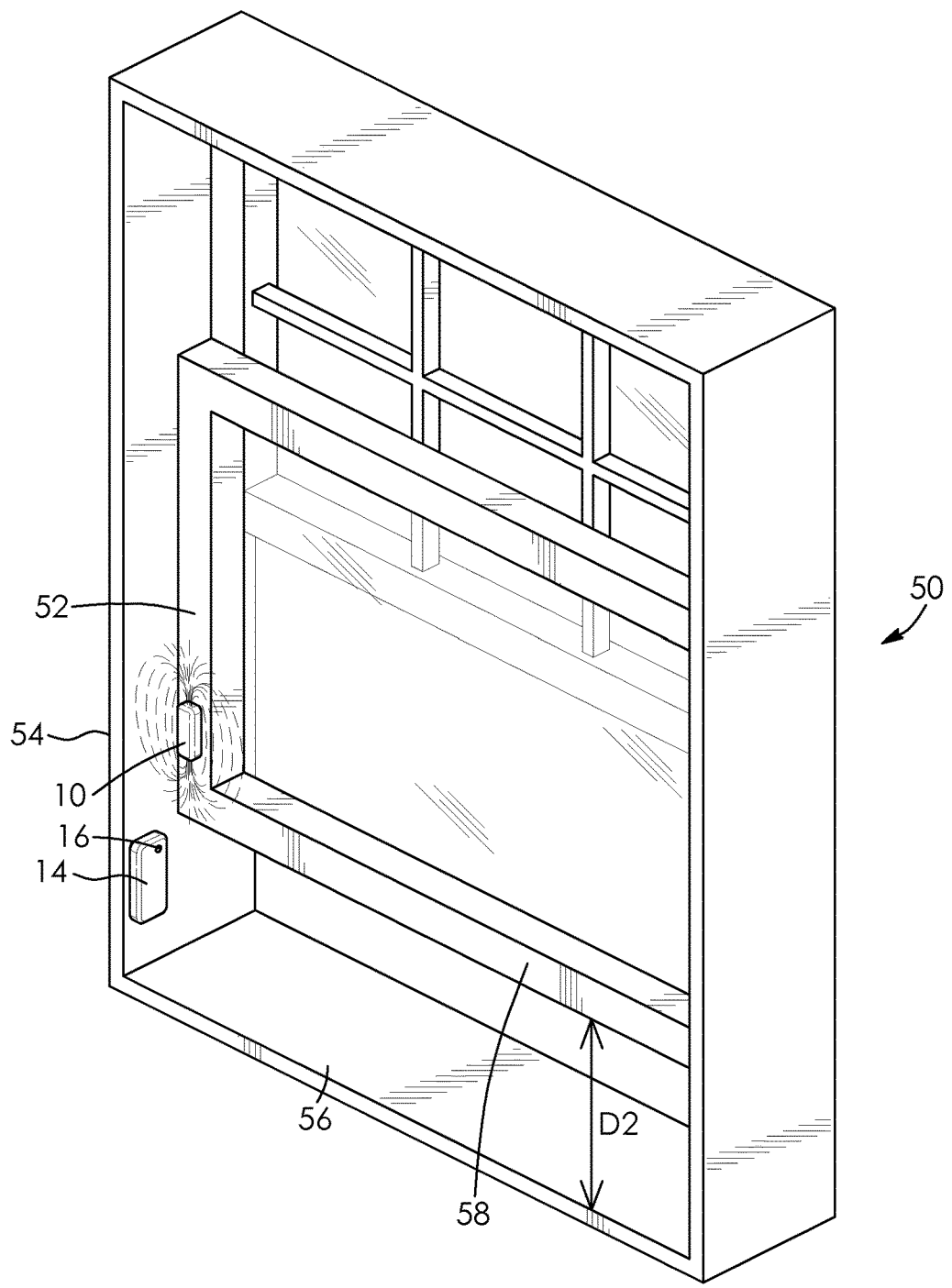
FIG. 13 is another perspective view showing the magnet and the magnetic field sensor of FIG. 1 being used as a window sensor in a security alarm system with the window opened a distance D2.
Figure 14:
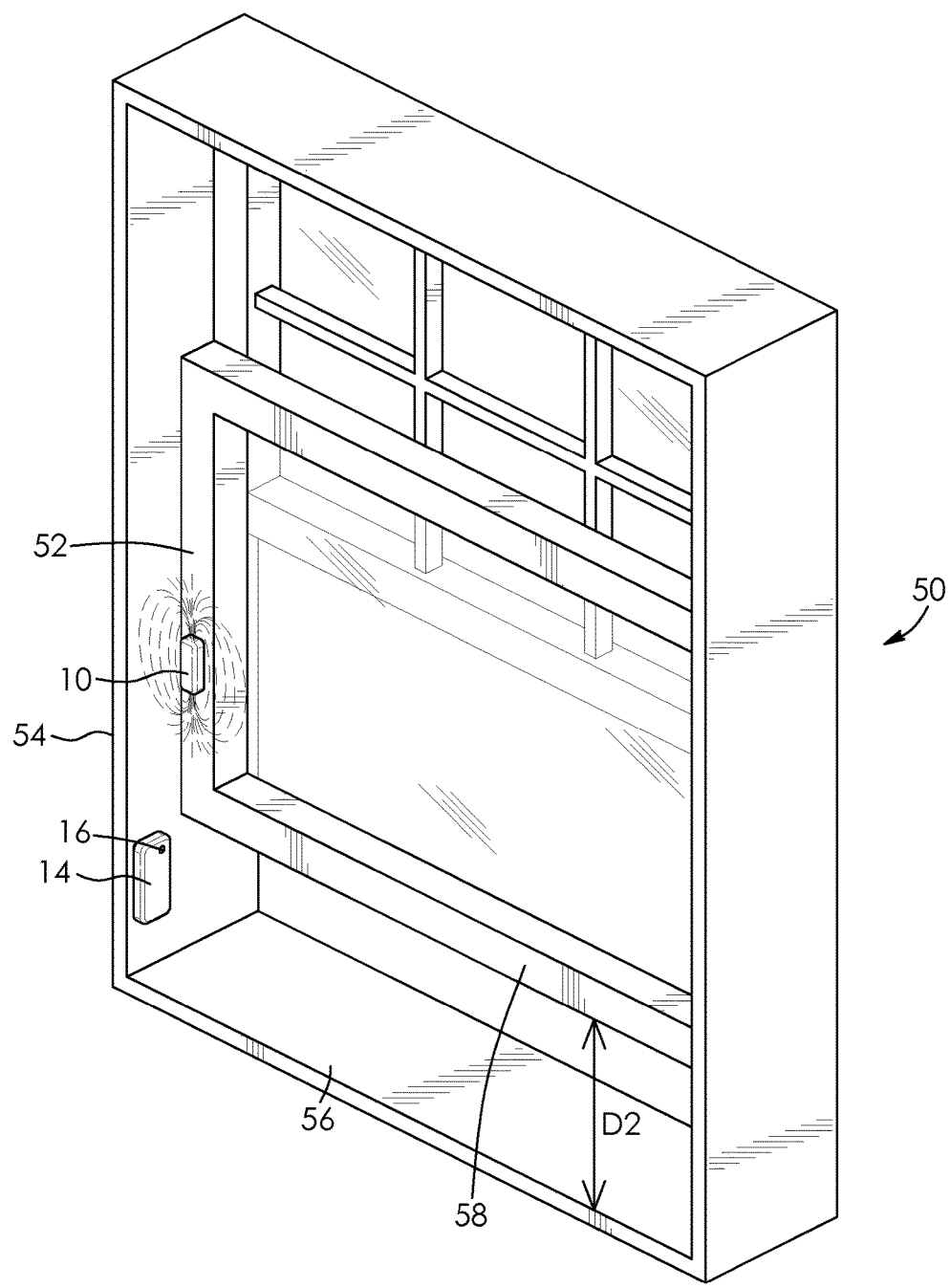
FIG. 14 is another perspective view showing the magnet and the magnetic field sensor of FIG. 1 being used as a window sensor in a security alarm system with the window opened a distance D2.
Figure 15:
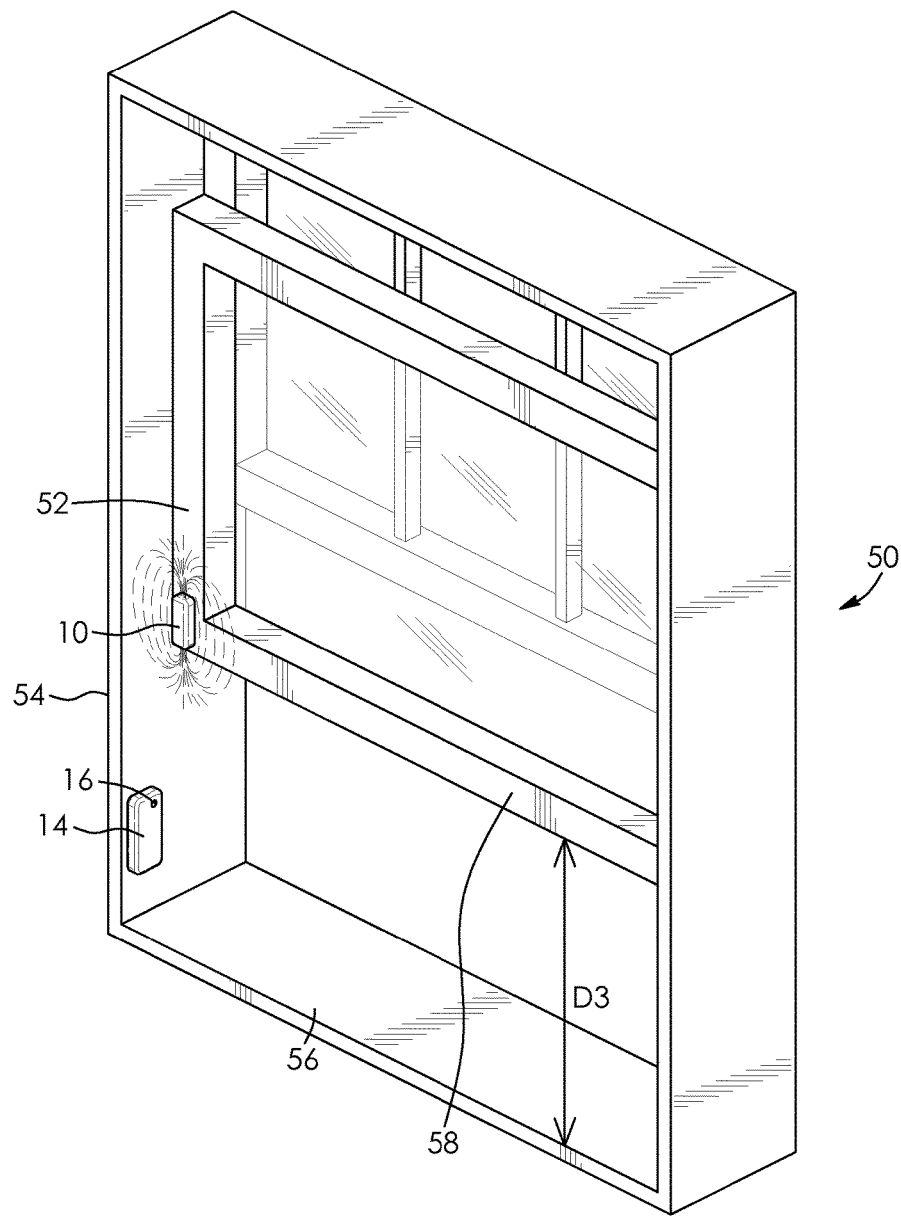
FIG. 15 is a perspective view showing the magnet and the magnetic field sensor of FIG. 1 being used as a window sensor in a security alarm system with the window opened a distance D3.

FIGS. 12 to 14 show where the magnet 10 may be positioned to avoid triggering an alarm when the window is opened a distance of D2 which is greater than D1. FIG. 12 shows that the magnetic field sensor 14 is able to sense a magnetic field generated by the magnet 10, as visually indicated by the indicator light 16 which is turned on, when the magnet 10 is mounted on the stile 52 adjacent to the bottom rail 58. FIG. 13 shows that the magnetic field sensor 14 is unable to sense the magnetic field generated by the magnet 10, as visually indicated by the indicator light 16 which is turned off, when the magnet 10 is mounted on the stile 52 away from the bottom rail 58. FIG. 14 shows that the magnetic field sensor 14 is also unable to sense the magnetic field generated by the magnet 10, as visually indicated by the indicator light 16 which is turned off, when the magnet 10 is mounted on the stile 52 further away from the bottom rail 58. The indicator light 16 accordingly provides a visual indication to an installer that the magnet 10 should be mounted on the stile 52 adjacent to the bottom rail 58, allowing the window 50 to be opened a distance of D2 without triggering an alarm. However, as shown in FIG. 15, opening the window a distance of D3 which is greater than D2 will trigger an alarm even if the magnet 10 is mounted on the stile 52 adjacent to the bottom rail 58. The indicator light 16 accordingly provides an installer with a visual indication to verify correct placement of the magnet 10 to allow a maximum threshold opening of the window 50. It will be understood by a person skilled in the art that mounting the magnet 10 on the stile 52 of the window 50 and mounting the magnetic field sensor 14 on the side jamb 54 of the window is only an example. The magnet 10 and the magnetic field sensor 14 may be mounted anywhere provided there is relative movement of the magnet 10 and the magnetic field sensor 14 when the window 50 is opened.

Figure 16:
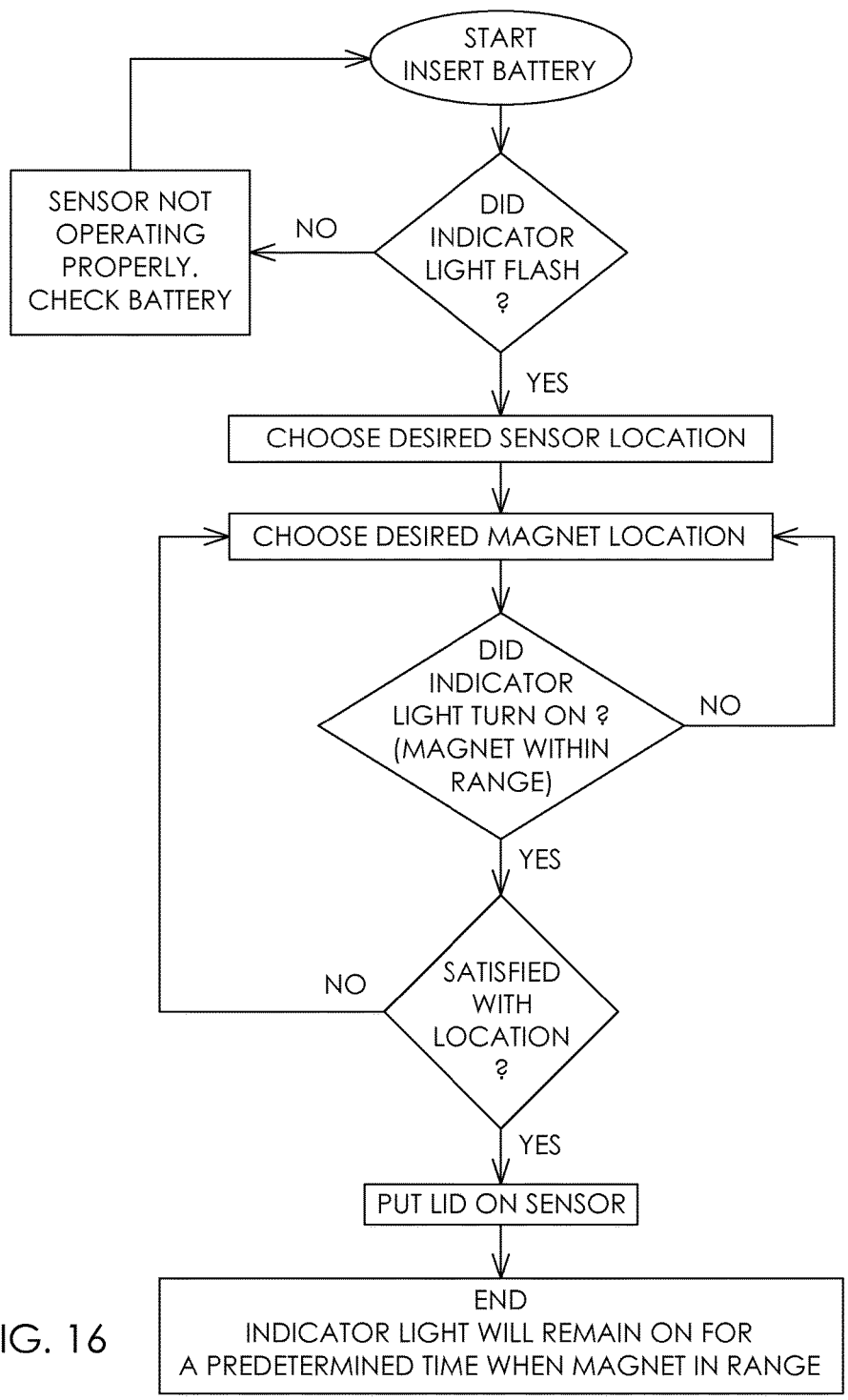
FIG. 16 is a flow chart showing the logic of installing the magnet and the magnetic field sensor relative to each other.

FIG. 16 is a flow chart showing the logic of installing the magnet 10 and magnetic field sensor 14 relative to each other. The coin cell battery 24 is first inserted into the magnetic field sensor 14 and the indicator light 16 flashes to indicate that the magnetic field sensor 14 has powered up and is functioning properly. If the indicator light 16 does not flash, then the magnetic field sensor 14 is not functioning properly and the coin cell battery 24 is removed and replaced. The magnetic field sensor 14 is next positioned in a desired location and the magnet 10 positioned in a desired location relative to the magnetic field sensor 14. The indicator light 16 will turn on when a magnetic field generated by the magnet 10 is sensed by the magnetic field sensor 14 and the indicator light 16 will turn off when a magnetic field generated by the magnet 10 is not sensed by the magnetic field sensor 14. The indicator light 16 accordingly assists an installer in determining proper relative positioning of the magnet 10 and magnetic field sensor 14. This allows the window 50 to be opened a certain distance without triggering the alarm. Once the installer is satisfied with the relative positioning of the magnet 10 and magnetic sensor 14, the lid of the magnetic field sensor 14 is closed. The indicator light 16 will then remain on for a predetermined period of time when a magnetic field generated by the magnet 10 is sensed by the magnetic field sensor 14.

The magnetic field sensor 14 is further provided with software having an algorithm which turns off the indicator light 16 after a predetermined period of time even if the magnetic field sensor 14 senses a magnetic field. This conserves the coin cell battery 24 of the magnetic field sensor 14 and does away with any visual annoyance resulting from the indicator light 16 being turned on when the window 50 is closed or opened less than a maximum threshold opening required to trigger an alarm. The magnetic field sensor 14 will however continue to otherwise operate normally and transmit a signal to trigger an alarm when the window 50 is opened and the magnetic field sensor 14 no longer senses a magnetic field generated by the magnet 10. The indicator light 16 is accordingly operable during installation of the window sensor and assists an installer in determining the relative positioning of the magnet 10 and magnetic field sensor 14 so as to allow the window 50 to be opened a certain distance without triggering the alarm. If an installer is unable to position the magnet 10 and magnetic field sensor 14 within the predetermined period of time before the software turns off the indicator light 16 then the lid of the magnetic field sensor 14 can be removed to restart the algorithm. This will result in another predetermined period of time in which the indicator light 16 is operable to assist an installer in determining the relative positioning of the magnet 10 and magnetic field sensor 14 so as to allow the window 50 to be opened a certain distance without triggering the alarm.

Figure 17:
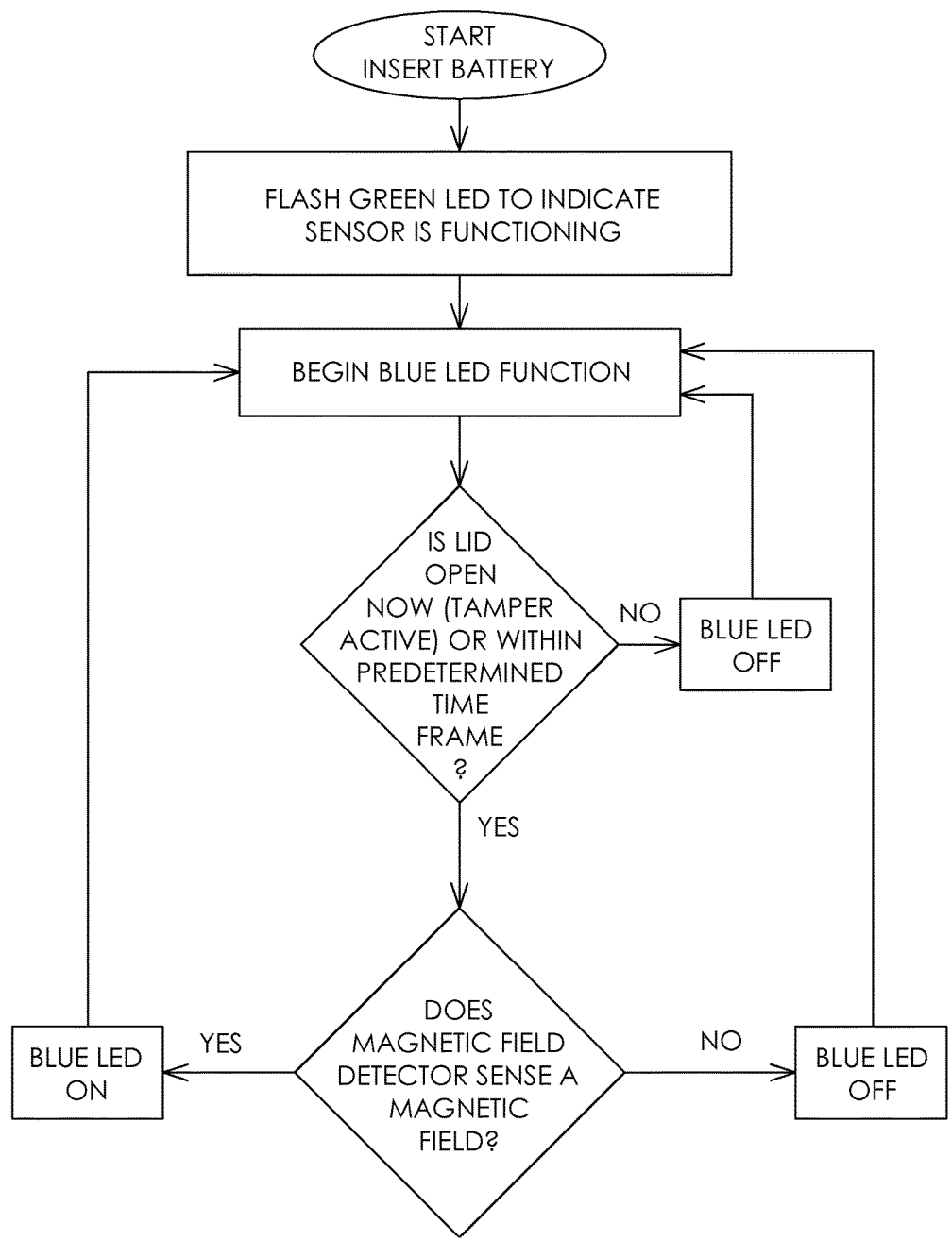
FIG. 17 is a flow chart showing the logic of a software algorithm which drives the magnetic field sensor.

FIG. 17 is a flow chart showing the logic of the algorithm. The coin cell battery 24 is first inserted into the magnetic field sensor 14 and the green light-emitting diode of the indicator light 16 turns on for a period of time, for example, five seconds. This indicates that the magnetic field sensor 14 has powered up and is functioning properly. The blue light-emitting diode of the indicator light 16 will then be operable. The magnet 10 and the magnetic field sensor 14 are next positioned relative to one another as shown in FIGS. 6 to 15. The blue light-emitting diode of the indicator light 16 will turn on when a magnetic field generated by the magnet 10 is sensed by the magnetic field sensor 14 and the blue light-emitting diode of the indicator light 16 will turn off when a magnetic field generated by the magnet 10 is not sensed by the magnetic field sensor 14. The indicator light 16 accordingly assists an installer in determining proper relative positioning of the magnet 10 and magnetic field sensor 14. Proper relative positioning of the magnet 10 and magnetic field sensor 14 may allow the window 50 to be opened a certain distance without triggering the alarm. If an installer is unable to position the magnet 10 and magnetic field sensor 14 within the predetermined period of time before the software turns off the indicator light 16 then the lid can be removed to restart the algorithm as shown in FIG. 17. The red light-emitting diode of the indicator light 16 will flash when the coin cell battery 24 runs down below a predetermined low battery threshold. The frequency of the flashing will increase as the battery continues to run down.

The software may run other routines as set out below during operation of the magnetic field sensor 14.

task 1:
   if tamper switch active (lid open) now or within past three minutes:
      if magnet is present:
         blue light-emitting diode ON
      else
         blue light-emitting diode OFF task 2
   if magnet becomes present or magnet becomes absent:
      send magnet-change message
         if battery is failing
            blink red light-emitting diode
         else
            if tamper switch active (lid open) now or within past three minutes:
               blink green light-emitting diode task 3:
   if approximately one hour has passed with no message sent:
      send supervisory message The example shown in FIGS. 1 to 17 comprises a magnetic field sensor 14 with an indicator in the form of an indicator light 16. However, it will be understood by a person skilled in the art that, in other examples, the indicator may be an auditory indicator which produces a sound to indicate the presence or absence of a magnetic field, or a vibratory indicator which vibrates to indicate the presence or absence of a magnetic field, or a combination of indicators selected from a visual indicator, an auditory indicator and a vibratory indicator. A switch may be used to select a desired indicator mode.

Figure 18:
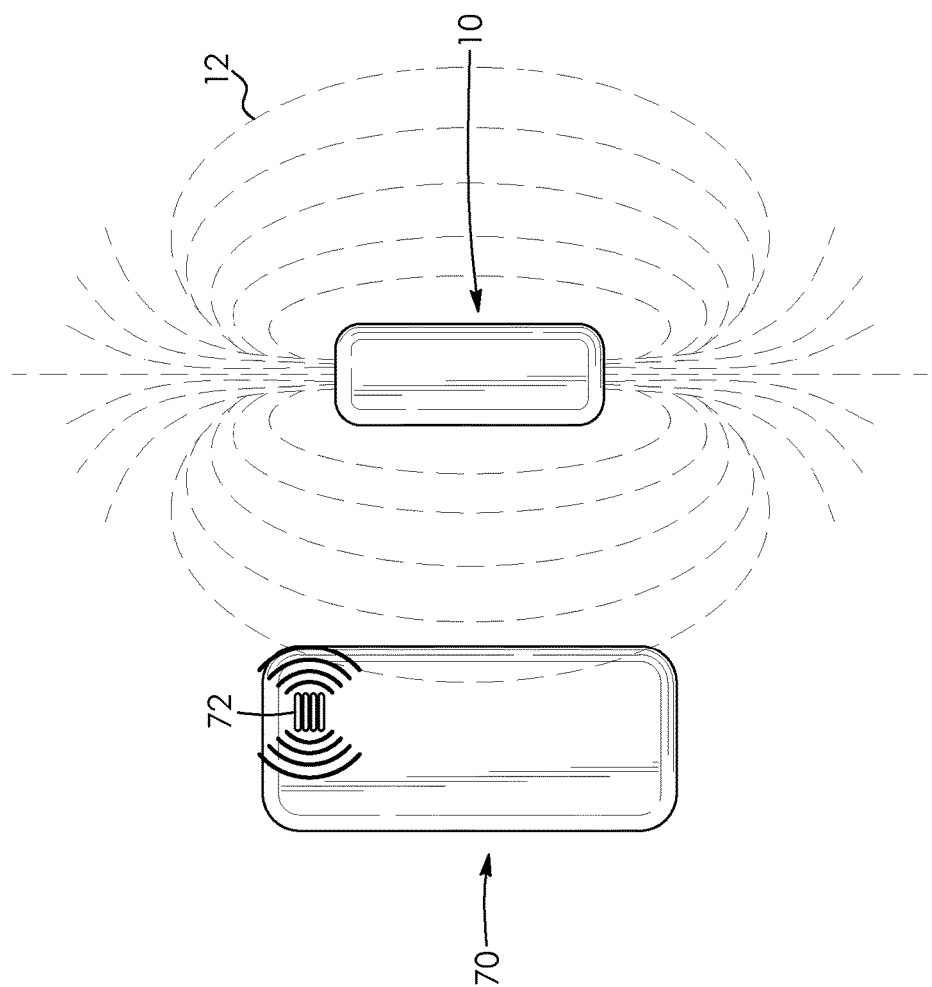
FIG. 18 is a perspective view of another improved magnetic field sensor.

FIG. 18 shows a magnetic field sensor 70 with an indicator in the form of an auditory indictor 72 that provides an auditory indication as to the presence or absence of a magnetic field. The auditory indicator 72 turns on and emits a sound when the magnetic field sensor 70 is within the magnetic field 12 generated by the magnet 10. This provides an auditory indication as to the presence of a magnetic field. However, after a predetermined period of time, the auditory indicator 72 will be turned off even in the presence of the magnetic field 12. This conserves power and does away with any auditory annoyance when the magnetic field sensor 70 is part of a proximity sensor in a security alarm system.

FIG. 19 shows a magnetic field sensor 80 with an indicator in the form of a vibratory indictor 82 that provides a vibratory indication as to the presence or absence of a magnetic field. The vibratory indicator 82 turns on and vibrates when the magnetic field sensor 80 is within the magnetic field 12 generated by the magnet 10. This provides a vibratory indication as to the presence of a magnetic field. However, after a predetermined period of time, the vibratory indicator 82 will be turned off even in the presence of the magnetic field 12. This conserves power and does away with any vibratory annoyance when the magnetic field sensor 80 is part of a proximity sensor in a security alarm system.

It will be understood by a person skilled in the art that many of the details provided above are by way of example only, and are not intended to limit the scope of the invention which is to be determined with reference to the following claims.

What is claimed is:

1. A magnetic field sensor comprising:
    a housing having a lid;
    a tamper switch which detects when the lid of the housing is opened;
    a device which senses a presence or an absence of a magnetic field;
    a power source, the magnetic field sensor being powered up when the lid of the housing is removed and the power source is inserted into the housing;
    a microprocessor, a signal being sent by the tamper switch to the microprocessor when the lid of the housing is open, and a signal being sent by the device to the microprocessor when a magnetic field is sensed; and
    an indicator which indicates the presence or the absence of a magnetic field, wherein the power source supplies current to the indicator, and the indicator turns on when a magnetic field is sensed and turns off when a magnetic field is not sensed; and
    wherein the indicator is initially operable following the power source being inserted into the housing and the magnetic field sensor being powered up, and the microprocessor renders the indicator inoperable a predetermined period of time after the lid of the housing is closed following the power source being inserted into the housing and the magnetic field sensor being powered up, and the indicator remaining inoperable until the lid of the housing is removed and the lid of the housing is closed again at which point the indicator is operable until the microprocessor again renders the indicator inoperable a predetermined period of time after the lid of the housing is closed again.

2. The magnetic field sensor as claimed in claim 1 wherein the indicator is an auditory indicator.

3. The magnetic field sensor as claimed in claim 1 wherein the indicator is a vibratory indicator.

4. The magnetic field sensor as claimed in claim 1 wherein the indicator is a visual indicator.

5. The magnetic field sensor as claimed in claim 4 wherein the indicator comprises a light emitting diode.

6. The magnetic field sensor as claimed in claim 1 wherein the power source is a coin cell battery.

7. The magnetic field sensor as claimed in claim 1 further including a supercapacitor.

8. The magnetic field sensor as claimed in claim 1 further including a radio and an antenna.

9. A proximity sensor including a magnet which generates a magnetic field and a magnetic field sensor, the magnetic field sensor comprising:
    a housing having a lid;
    a tamper switch which detects when the lid of the housing is opened;
    a device which senses a presence or an absence of a magnetic field;
    a power source, the magnetic field sensor being powered up when the lid of the housing is removed and the power source is inserted into the housing;
    a microprocessor, a signal being sent by the tamper switch to the microprocessor when the lid of the housing is open, and a signal being sent by the device to the microprocessor when a magnetic field is sensed; and
    an indicator which indicates the presence or the absence of a magnetic field, wherein the power source supplies current to the indicator, and the indicator turns on when a magnetic field is sensed and turns off when a magnetic field is not sensed; and
    wherein the indicator is initially operable following the power source being inserted into the housing and the magnetic field sensor being powered up, and the microprocessor renders the indicator inoperable a predetermined period of time after the lid of the housing is closed following the power source being inserted into the housing and the magnetic field sensor being powered up, and the indicator remaining inoperable until the lid of the housing is removed and the lid of the housing is closed again at which point the indicator is operable until the microprocessor again renders the indicator inoperable a predetermined period of time after the lid of the housing is closed again.

10. A security alarm system having a proximity sensor, the proximity sensor including a magnet which generates a magnetic field and a magnetic field sensor, the magnetic field sensor comprising:
    a housing having a lid;
    a tamper switch which detects when the lid of the housing is opened;
    a device which senses a presence or an absence of a magnetic field;
    a power source, the magnetic field sensor being powered up when the lid of the housing is removed and the power source is inserted into the housing;
    a microprocessor, a signal being sent by the tamper switch to the microprocessor when the lid of the housing is open, and a signal being sent by the device to the microprocessor when a magnetic field is sensed; and
    an indicator which indicates the presence or the absence of a magnetic field, wherein the power source supplies current to the indicator, and the indicator turns on when a magnetic field is sensed and turns off when a magnetic field is not sensed; and
    wherein the indicator is initially operable following the power source being inserted into the housing and the magnetic field sensor being powered up, and the microprocessor renders the indicator inoperable a predetermined period of time after the lid of the housing is closed following the power source being inserted into the housing and the magnetic field sensor being powered up, and the indicator remaining inoperable until the lid of the housing is removed and the lid of the housing is closed again at which point the indicator is operable until the microprocessor again renders the indicator inoperable a predetermined period of time after the lid of the housing is closed again.

* * * * *